United States Patent
Zhao et al.

(10) Patent No.: US 8,877,531 B2
(45) Date of Patent: Nov. 4, 2014

(54) ELECTRONIC APPARATUS

(75) Inventors: Lihua Zhao, Sunnyvale, CA (US); Hao Luo, Milpitas, CA (US); Carl P. Taussig, Redwood City, CA (US); James A. Brug, Menlo Park, CA (US); Richard E. Elder, Palo Alto, CA (US); Warren Jackson, San Francisco, CA (US); Ping Mei, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 728 days.

(21) Appl. No.: 13/074,259

(22) Filed: Mar. 29, 2011

(65) Prior Publication Data

US 2012/0074433 A1    Mar. 29, 2012

Related U.S. Application Data

(63) Continuation-in-part of application No. 12/891,414, filed on Sep. 27, 2010, now Pat. No. 8,568,182.

(51) Int. Cl.
*H01L 21/00* (2006.01)
*H01L 27/15* (2006.01)
*H01L 51/00* (2006.01)

(52) U.S. Cl.
CPC .......... *H01L 51/0024* (2013.01); *H01L 27/156* (2013.01)
USPC .. 438/34; 257/88; 257/E33.056; 257/E51.018

(58) Field of Classification Search
USPC ................ 257/88, E33.056, E51.018; 438/34
See application file for complete search history.

(56) References Cited

U.S. PATENT DOCUMENTS

| | | |
|---|---|---|
| 6,169,686 B1 | 1/2001 | Brug et al. |
| 6,607,924 B2 | 8/2003 | Brug et al. |
| 6,653,030 B2 | 11/2003 | Jeans et al. |
| 6,677,174 B2 | 1/2004 | Kim et al. |
| 6,683,322 B2 | 1/2004 | Jackson et al. |
| 6,727,105 B1 | 4/2004 | Brug et al. |
| 6,835,953 B2 | 12/2004 | Cok et al. |
| 6,861,365 B2 | 3/2005 | Taussig et al. |
| 6,864,529 B2 | 3/2005 | Mei et al. |
| 6,930,368 B2 | 8/2005 | Hartwell et al. |
| 6,937,509 B2 | 8/2005 | Perner et al. |
| 6,939,737 B2 | 9/2005 | Palanisamy |
| 6,965,361 B1 | 11/2005 | Sheats et al. |
| 7,031,185 B2 | 4/2006 | Perner et al. |
| 7,056,834 B2 | 6/2006 | Mei et al. |
| 7,057,258 B2 | 6/2006 | Tran et al. |
| 7,115,983 B2 | 10/2006 | Wagner |
| 7,161,838 B2 | 1/2007 | Mei et al. |
| 7,195,950 B2 | 3/2007 | Taussig |

(Continued)

OTHER PUBLICATIONS

Chen, Yi-Chia, et al., "A Fluxless Bonding Technology Using Indium-Silver Multilayer Composites," IEEE Transactions on Components, Packaging, and Manufacturing Technology—Part A, vol. 20, No. 1, Mar. 1997, pp. 46-51.

(Continued)

*Primary Examiner* — Marvin Payen
(74) *Attorney, Agent, or Firm* — Patterson & Sheridan, LLP

(57) ABSTRACT

An electronic apparatus is provided that includes a number of first components on a first substrate and a number of second components on a second substrate. A lamination material that includes a conducting material is placed between the first components and the second components. Any one first component can couple to a varied subset of second components.

8 Claims, 7 Drawing Sheets

(56) References Cited

U.S. PATENT DOCUMENTS

| | | |
|---|---|---|
| 7,202,179 B2 | 4/2007 | Taussig et al. |
| 7,291,564 B1 | 11/2007 | Jackson |
| 7,304,364 B2 | 12/2007 | Perlov et al. |
| 7,341,893 B2 | 3/2008 | Mei et al. |
| 7,425,165 B2 | 9/2008 | Kim et al. |
| 7,476,557 B2 | 1/2009 | Daniels et al. |
| 7,541,227 B2 | 6/2009 | Mei et al. |
| 7,585,424 B2 | 9/2009 | Mei |
| 7,678,626 B2 | 3/2010 | Perlov et al. |
| 7,718,077 B1 | 5/2010 | Kim et al. |
| 7,764,013 B2 | 7/2010 | Lee et al. |
| 7,795,062 B2 | 9/2010 | Taussig et al. |
| 7,816,722 B2 | 10/2010 | Fricke et al. |
| 2010/0019222 A1 | 1/2010 | Yan et al. |
| 2010/0102300 A1 | 4/2010 | Burroughes et al. |

OTHER PUBLICATIONS

Kim, Changsoon, et al., "Micropatterning of Organic Electronic Devices by Cold-Welding," Science Magazine, vol. 288, May 5, 2000, pp. 831-833.

Lauvernier, D., et al., "Metal Bonding with Ultra-thin Layer for Optical Applications," Proceedings Symposium IEEE/LEOS, Benelux Chapter, Brussels, 2007, pp. 79-82.

Indium Corporation, "Alloy Sorted by Temperature," Available at http://www.indium.com/products/alloy_sorted_by_temperature.pdf (Last accessed on Nov. 5, 2010).

300

400

500

600

ELECTRONIC APPARATUS

RELATED CASES

This application is a continuation-in-part of U.S. patent application Ser. No. 12/891,414, entitled "Display," which was filed on Sep. 27, 2010, now U.S. Pat. No. 8,568,182 and is included by reference in this application as if set forth in its entirety herein for all purposes.

BACKGROUND

Organic light emitting diodes, or OLEDs, are organic structures that emit light in response to an applied current. OLEDs may be used to make intricately patterned displays. Such displays can be used in numerous devices, including cell phone screens and other small displays. However, challenges in fabrication may make the use of OLEDs in larger screens cost prohibitive.

BRIEF DESCRIPTION OF THE DRAWINGS

Certain exemplary embodiments are described in the following detailed description and in reference to the drawings, in which.

DETAILED DESCRIPTION

Current techniques for forming OLEDs often require very accurate alignment between OLED structures and backplane structures so that a particular pixel in the backplane energizes a target pixel. However, alignment of successive layers in OLED displays, for example, fabricated on plastic, can be problematic because of the variation in dimensions that result from the processing. This may be a greater issue for roll-to-roll fabrication where a rigid carrier is not used.

In embodiments, a method of integration is presented that does not require precise alignment. The technique is based on making a large number of similar, or even identical, functional units on a first substrate and a series of active cells on a second substrate. Lamination of the two substrates, with the functional cells facing the active cells forms the structure. Precise alignment is not needed, as the active cells will energize any of the functional units that they contact. Other functional units that are not in contact with any active cells are not energized and do not interfere with the functioning of the active cells.

Embodiments of the present techniques provide a method of lamination that may be used in this method of integration. One skilled in the art will recognize that the present techniques are not limited to OLEDs or even displays, but may be used in any electronics application in which alignment of functional units can be problematic. However, to simplify the explanation, an OLED application is detailed below.

Figure 1:
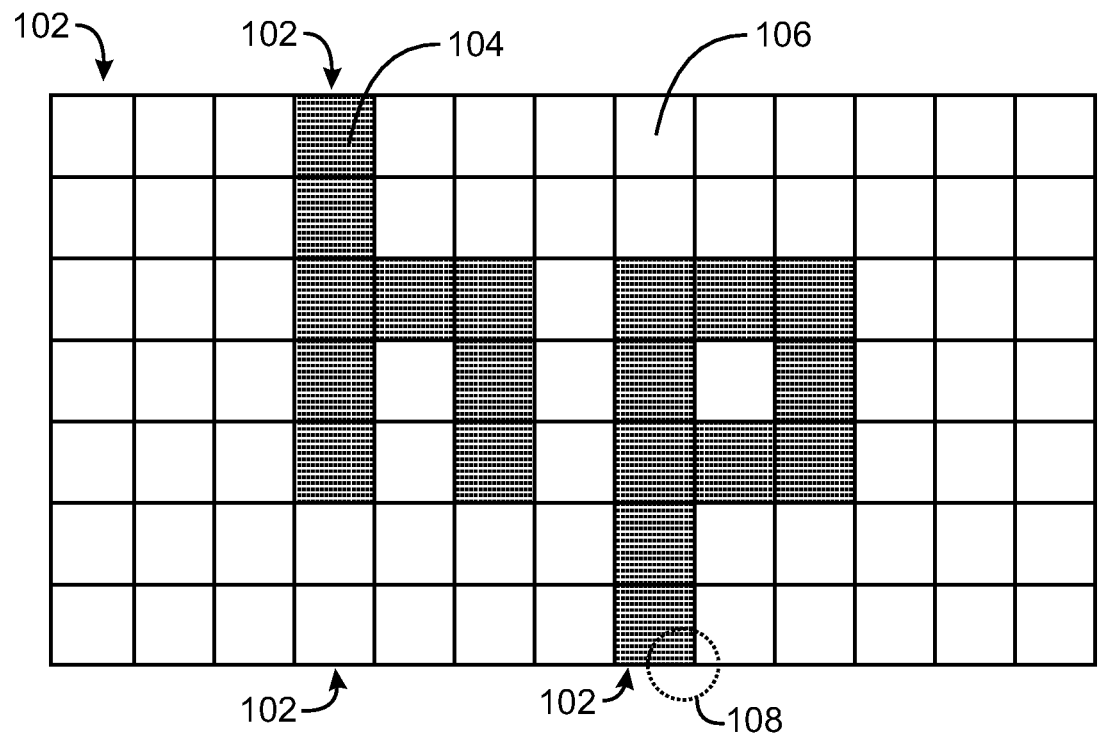
FIG. 1 is a drawing of an OLED display, in accordance with embodiments.

FIG. 1 is a drawing of an OLED display 100, in accordance with embodiments. The OLED display 100 may have a number of pixels 102 configured to emit light when energized. The OLED display 100 can display data by activating a first set of pixels 104 while leaving a second set of pixels 106 powered off. Although the pixels 102 shown in the exemplary OLED display 100 are relatively large in comparison to the data displayed, in other embodiments, the pixel size can be selected based on the application. Furthermore, display applications will generally use multiple pixels, each having a different color such as red, green, and blue, to generate color images.

Applications used for the display of image, video, or text data may have pixels 102 that are a smaller percentage of the total screen size to provide high resolutions. For example, in a large sign or stadium display of about 10 m in width the pixels 102 may be as large as 5 mm. If adjacent pixels are used to provide different colors for generating color images, then this can provide a horizontal resolution of about 667 pixels for the display. In smaller displays, the pixels may be 500 μm, 250 μm, 100 μm, 10 μm, or even smaller. For example, in a display of about 30 cm in width, the pixels may be around 50 μm to provide an equivalent resolution of about 1900 pixels. Each pixel 102 may include numerous light emitting units, which can be termed micro-OLEDs. The micro-OLEDs are functional light emitting structures or cells that may be activated as a group by an active cell or pixel in an electronic backplane. This can be further seen by a close-up view of an area 108 of the OLED display discussed with respect to FIG. 2.

Figure 2:
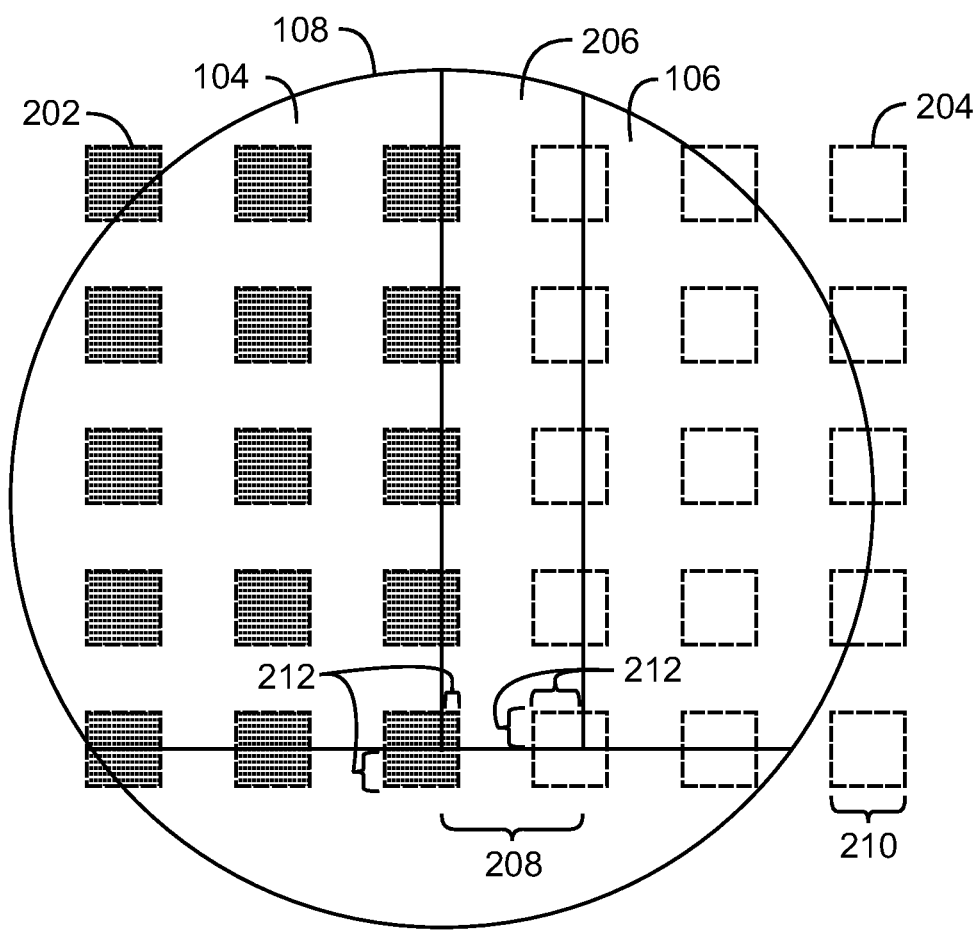
FIG. 2 is a close up view of an area of the OLED display of FIG. 1, illustrating the lighting of a number of micro-OLEDs by an energized pixel, in accordance with an embodiment.

FIG. 2 is a close up view 200 of an area 108 of the OLED display 100 of FIG. 1, illustrating the lighting of a number of micro-OLEDs 202 by an energized pixel 104, in accordance with an embodiment. An adjacent pixel 106 is not energized, leaving the associated micro-OLEDs 204 dark. The pixels 104 and 106 may be separated by an insulator 206, which may function as a sealant to protect the OLED electrode from environmental factors such as moisture or oxygen. If the material 206 is thicker than the pixels, the insulator may also serve to protect the pixel from mechanical damage. For example, such damage may arise from the particles in the lamination layer which, when sandwiched between the layers described below, are pressed into the OLED top contact. Further, a similar insulator may also used between micro-OLEDs 202 to protect the street between micro-OLEDs 202 from mechanical damage. The insulator layer may be formed out of $SiO_2$, SiN, or a lithographic material, such as SU8, and the like. The insulator 206 has a width 208 greater than the width 210 of the micro-OLEDs 202 and 204.

Accordingly, the pixels 104 and 106, which are generally formed on an electronic backplane, do not need to be perfectly aligned with the micro-OLEDs 202 and 204, which are generally formed on a substrate, to operate correctly. This is illustrated in FIG. 2 by the offsets 212 of the micro-OLEDs 202 and 204 from the pixels 104 and 106. Any portion of a micro-OLED 202 and 204 that overlaps a pixel 104 and 106 may be fully energized by that pixel 104 and 106. Any micro- OLED 202 and 204 that does not overlap a pixel 104 and 106, for example, being fully covered by the insulator 206, will not light or otherwise interfere with the display 100. Accordingly, a pixel may energize a varied subset of the micro-OLEDs 202, and generate a display 100 without needing precise alignment between substrates, which may make the production of a flexible display structure using a lamination technique, as discussed with respect to FIG. 3, more feasible.

Figure 3:
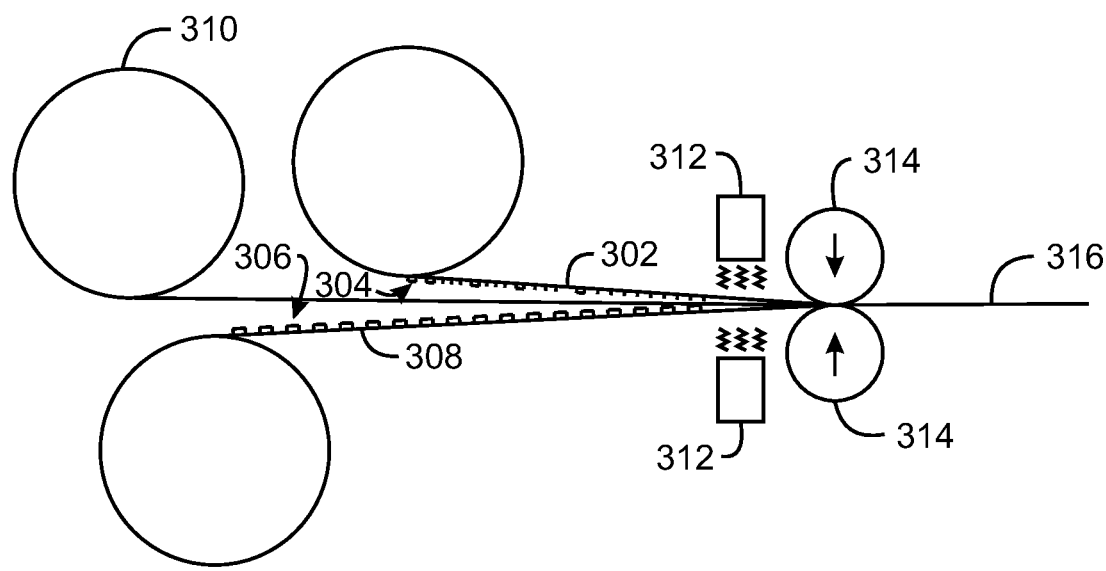
FIG. 3 is a drawing of the lamination of a substrate containing OLED structures to an electronic backplane to form an OLED display, in accordance with an embodiment.

FIG. 3 is a drawing of the lamination 300 of a substrate 302 containing OLED structures 304 to an electronic backplane 306 to form an OLED display 100, in accordance with an embodiment. The lamination 300 may be performed by joining micro-OLED structures 304 supported on a first substrate 302 to an electronic backplane 306 on a second substrate 308. A lamination material 310 may be used to join the substrates. The lamination material 310 may be formed with embedded anisotropic conductors that allow a high current to flow from one side to the other, but substantially block current flow down the lamination material 310. This is discussed further with respect to FIG. 4.

The substrates 302 and 308 are positioned so that the micro-OLED structures 304 and the electronic backplane structures 306 are facing each other prior to lamination. As noted above, the alignment between the structures 304 and 306 is not highly critical.

The substrates 302 and 308 and the lamination material 310 may be heated to soften or melt a bonding layer, for example, the matrix of the lamination material 310. The heating may be performed by passing the substrates 302 and 308 and the lamination material 310 through radiant heaters 312. For example, in one embodiment the radiant heaters 312 may heat the substrates 302 and 308 and the lamination material 310 to greater than about 60° C. to soften the bonding layer. The heating is not limited to radiant heaters 310, but may be performed by heating rolls 314 used to provide pressure for laminating or by any number of other techniques.

Further, the lamination 300 may be performed without the addition of heat. For example, the lamination material 310 may be cold welded to a metal pad associated with a pixel on the electronic backplane 308 by pressure from the rolls 314. Further, the matrix of the lamination material 310 may be a conductive adhesive that can be cured by UV light. In this case, the radiant heaters 312 may be replaced by UV lights to initiate the curing process. Depending on the type of bonding materials and bonding methods, the lamination 300 may be performed using a force in the range of about 0 MPa to 10 MPa.

The lamination material 310 is not limited to a separate sheet or layer, but may also include a bonding material applied directly to either the micro-OLED structures 304 or the electronic backplane structures 306, or both, before lamination. This may be in the form of liquid bonding material that can be applied by any of a number of methods of coating, such as printing, spraying, or slot coating.

Further, the lamination material 310 is not limited to "anisotropic" materials in which the metal particles, or other conductive materials, are far apart to prevent in-plane conduction. In an embodiment the lamination material 310 can be "isotropic," or conducting in-plane, and the conduction can be broken between pixels by some patterning method such as printing the material over a pixel pad, such as discussed with respect to FIG. 6. The patterned lamination material 310 does not have to be aligned with specific OLED structures 304 or electronic backplane structures 306, but will allow energization of any OLED structures 304 that overlap an electronic backplane structure 306.

The lamination 300 of the substrates 302 and 308 and lamination material 310 forms a flexible sheet 316 that may be used as a display. The method described herein involves a direct lamination process using a well-defined micro-OLED frontplane and a pixelated backplane without any additional alignment between these two pieces. Through this process, the pixel structure on the OLED display is defined by the backplane. The techniques for joining the substrates 302 and 308 are not limited to the lamination 300 procedure shown in FIG. 3. Thus, hard substrates may be used to support the OLED structures 304, the electronic backplane structures 306, or both, as described below.

Figure 4:
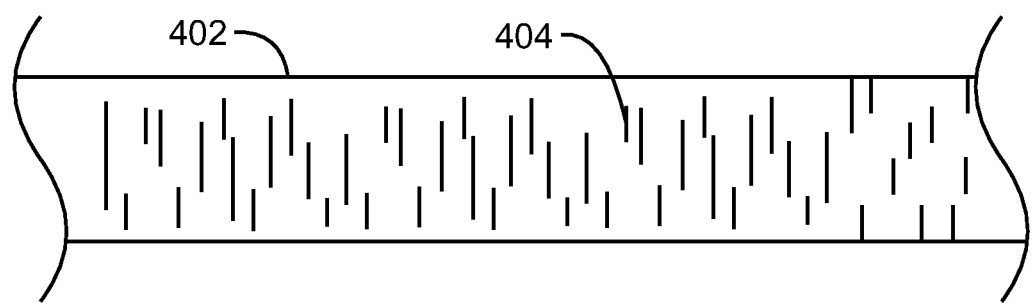
FIG. 4 is a cross-sectional view of a laminating material, in accordance with an embodiment.

FIG. 4 is a cross-sectional view of a laminating material 400, in accordance with an embodiment. The laminating material 400 may have a matrix 402 made from any number of materials, including, for example, polyesters, polyimides, polyacrylates, polycarbonates, silicone polymers, or any other number of polymers, organic and inorganic, and/or hybrid materials. In some embodiments the matrix 402 of the laminating material 400, itself, is made from an anisotropic conducting material, such as a conductive polymer. In some embodiments, the laminating material 400 includes anisotropic conductive material 404, such as metal flakes and/or particles, carbon nanotubes, and the like, aligned across the profile of the laminating material 400. Further, the matrix 400 may include an adhesive that may be cured by UV light or heat.

Figure 5:
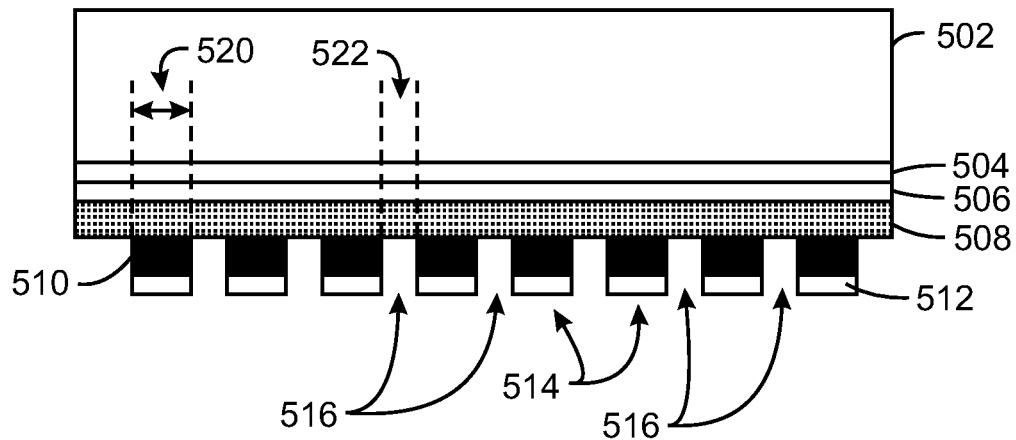
FIG. 5 is a cross-sectional view of an OLED structure formed on a substrate, in accordance with embodiments.

FIG. 5 is a cross sectional view of an OLED structure 500 formed on a substrate 502, in accordance with embodiments. The substrate 502 may include any number of substantially transparent materials, both flexible and rigid. As used herein, "substantially transparent" includes any material that has a transmissibility of greater than about 70% at some point in the visible spectrum, for example, at wavelengths of light in the range of about 350 nm to about 750 nm. Suitable flexible materials that may be used for the substrate 502 include polyesters, polyimides, polyacrylates, polycarbonates, silicone polymers, or any other number of polymers, organic and inorganic. The flexible materials may be processed in an extruder to form a sheet or roll of substrate 502. Suitable rigid materials that may be used for the substrate include glass, quartz, sapphire, rigid plastics, or any number of other materials. The rigid materials may be cast, or purchased from commercial source, for use as the substrate 502.

An electrode layer 504 can be formed over the substrate, for example using vacuum deposition, chemical vapor deposition, or any number of other techniques known in the art. The electrode layer 504 will generally also be substantially transparent as described above. Suitable materials can include metal oxide layers, for example, indium-tin-oxide (ITO), metal layers, carbon nanotubes, graphite layers, or any number of other materials.

A hole injection layer 506 can be formed over the electrode layer 504, for example, using spin coating, blade coating, evaporation or any number of other techniques known in the art. The hole injection layer 506 can be poly(3,4-ethylenedioxythiophene) (PEDOT), a composite of PEDOT with PSS (poly(styrenesulfonate)), or any number of other suitable materials. In some embodiments, a hole transport layer, including, for example, triphenylamine or derivatives, poly [(9,9-dioctylfluorenyl-2,7-diyl)-co-(N,N' bis(4-butylphenyl-1,1'-biphenylene-4,4'-diamine))], or any number of other polymer derivatives thereof, may be applied over the hole injection layer 506 to enhance the operation and stability of the OLED structures.

An organic light emitting layer 508 can be applied over the hole injection layer 506, for example, using blade coating, spin coating, printing, evaporation, or any number of other techniques known in the art. The OLED material 508 may be any organic small molecules, organometallic compounds, organic polymers, or combinations thereof that emit light in response to an applied voltage. Examples of materials that may be used include poly(9,9-dioctylfluorene-co-benzothiadiazole) (F8BT), polyfluorene (PFO), 2-methoxy-5-(2-ethylhexyloxy)-p-phenylenevinylene (MEH-PPV), tris(8-hydroxyquinolinato)aluminum (Alq3), tris(2-phenylpryidine) iridium(III), and many others. Although the layers 504, 506, and 508 are shown in FIG. 5 as contiguous, they may be patterned using any number of techniques, such as etching.

Blends of various OLED materials may be used to achieve a white emitting layer. In some embodiments, a white emitting layer may be used across the entire OLED structure 500. In these embodiments, a filter may be used in another layer, for example, on the outside of the substrate 502, to achieve multiple colors. However, the OLED layer 508 is not limited to OLED material of a single color, and multiple colors may be applied over the electrode layer 504, for example, printed using an ink-jet type printer technology.

An electron injection layer 510 may be formed over the OLED layer 508, for example, by vacuum deposition or chemical vapor deposition, or any number of other techniques known in the art. The electron injection layer 510 may include any number of compounds that facilitate the injection of electrons into the OLED layer 508. For example, the electron injection layer 510 can include LiF, Ca, CsF, or any number of other metals, salts, or combinations thereof. Although shown as broken structures, the electron injection layer 510 and the following structures may initially be formed as contiguous layers, and then patterned by removing a portion of material.

A metal cathode 512 may be formed over the electron injection layer 510 to protect the electron injection layer 510 and to facilitate current flow. The metal cathode 512 may be formed by vacuum deposition, chemical vapor deposition, or any number of other techniques known in the art. The metal cathode 512 may include materials such as aluminum, silver, gold, or any number of other metals. The electron injection layer 510 and metal cathode 512 can be formed as contiguous layers across the entire surface of the OLED layer 508.

For patterning, the metal cathode 512 may be covered with an insulating layer, which can be etched to expose portions of the metal cathode 512 for electrical connections. This may be performed by using the metal cathodes as a shadow mask to directly etch specific regions of the insulating layer. For example, an insulating layer can be uniformly deposited over the metal cathode 512. The insulating material may include a 200 nm thick layer of silicon nitride (SiN).

A negative photoresist, such as SU-8, may then be coated over the SiN layer. The photoresist may be exposed to UV through the transparent substrate 502, e.g., from above the OLED structure 500 as shown in FIG. 5. Because the metal cathodes 512 can block the UV, only those areas in the streets between metal cathodes 512 get full exposure.

The SU-8 above the micro pads area may be removed after developing, for example, by chemical etching. Reactive ion etching (RIE) can be used to remove the exposed SiN layer on the metal cathodes 512, leaving the metal exposed for electrical connections. The residual SU-8 may be left on the street area to assist in preventing particles 404 in the lamination layer 400, or other bonding materials, from puncturing through the OLED stack 504-508. Other self-aligned methods and materials can similarly be used to pattern the street space between the metal cathodes. The interpixel space material can be the thickness of the OLED stack 514 or thicker. The thicker structure can provide sealing of the OLED 514 from environmental factors such as oxygen or moisture and further increase the mechanical protection from particles 404 in the lamination layer 400.

In embodiments, once these layers are formed, portions can be removed to form electrode structures 514 that are separated by non-conductive zones 516. The electrode structures 514 energize the portion of the OLED layer 508 that is proximate to the electrode structures 514. The energized portion of the OLED layer may be termed a micro-OLED 520. The parts 522 of the OLED layer 508 that are adjacent to the non-conductive zones 516 are not energized by any of the electrode structures 514 and, thus, can remain dark.

Removing the portions of the electron injection layer 510 and metal cathode 512 to form the non-conductive zones 516 may be performed by subtractive patterning. Such techniques may include plasma etching, chemically reactive plasma etching, laser ablation, and cold welding, among many other techniques. For example, subtractive patterning by plasma etching or chemically reactive etching may be performed by forming a lithographic mask over the metal cathode 512. Once the lithographic mask is fixed, unexposed portions may be dissolved away, exposing portions of the metal cathode 512. The surface may then be exposed to a plasma or chemically reactive plasma, which may etch out the exposed portions of the metal cathode 512 and the underlying portions of the metal cathode 512 followed by the electron injection layer 510 to form the non-conductive zones 516. The total etching time may be controlled by the sensitivity of the organic light emitting layer 508 to damage from the etchant, as undercutting the electrode structures 514 may result in a less functional structure. In embodiments, the resulting electrode structures 514 may be sized to create micro-OLEDs of about 1 μm, 5 μm, 10 μm, 20 μm, 50 μm, 100 μm, or larger in width.

As mentioned, subtractive patterning may also be performed by cold welding. In this technique, a patterned metal surface may be pressed against the metal cathode 512. Under high pressure, the patterned metal surface welds to the metal cathode 512 and may cut at the edges of the patterns on the patterned metal surface. Removal of the patterned metal surface may also remove portions of the metal cathode 512 and the attached electron injection layer 510. This can form the non-conductive zones 516 as a negative image of the patterned metal surface. The metal cathode 512 of the electrode structures 514 can be used to bond the electrode structures 514 to metal pads associated with the pixels of the electronic backplane, for example, through the lamination layer 400 (FIG. 4) described above.

Subtractive patterning may also be performed by laser ablation. In this technique, portions of the metal cathode 512 may be exposed to a suitable laser and removed. Removal of portions of the metal cathode 512 exposes the injection layer 510 to the laser. The non-conductive zones 516 can be formed by the removal of both layers 510 and 512.

In addition to the subtractive patterning methods, the non-conductive zones 516 between the micro-OLEDs may also be formed by using a mask to prevent the deposition of the metal 512 and the electron injection material 510, i.e., shadow masking. The shadow mask may be used, for example, to form a regular pattern of conducting zones. The OLED structures may be energized by any backplane structure that overlaps a connected conducting zone. Thus, the OLED structures do not need to be aligned with specific conducting zones.

Figure 6:
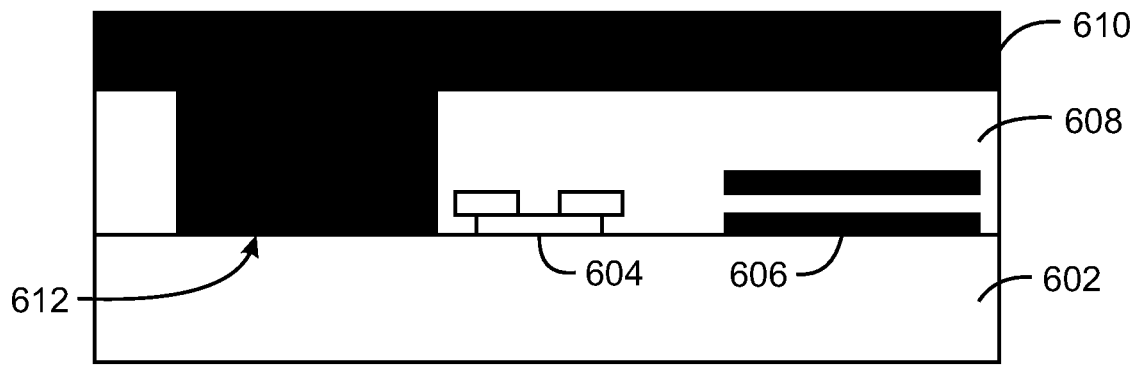
FIG. 6 is a cross section of a pixel in an electronic backplane, in accordance with an embodiment.

FIG. 6 is a cross section of a pixel 600 in an electronic backplane, in accordance with an embodiment. The electronic backplane may be formed using any number of fabrication techniques known in the art, including, for example, any combinations of chemical vapor deposition, lithography, plasma etching, and reactive etching, among others. The pixel 600 is formed on a substrate 602, which may be selected from any of the materials discussed with respect to the substrate 502 for the OLED structure 500. The two substrates 502 and 602 do not have to be formed from the same materials, but may be formed from different materials.

In the pixel 600, a thin film transistor (TFT) 604 may be formed over the substrate 602, along with a holding capacitor 606. Both the TFT 604 and holding capacitor 606 may be covered by an insulating layer 608. The materials used to form the electronic components of the pixel 600, may include any combinations of silicon, gallium/arsenide, or any other semiconducting materials. As will be recognized, the semiconducting materials can be appropriately doped to form n or p channels in the transistor, for example, by ion implantation or other techniques know in the art. The insulating layer 608 may be an undoped semiconducting material, such as silicon, and the like, or may be any number of other materials used for this function in the electronic arts, including, for example, silicon carbide, silicon nitride, polyimide, or other organic or inorganic materials.

A pixel pad 610 may be coupled to the TFT 604 through a via 612 extending through the insulating material 608. The pixel pad 610 can carry the current used to energize an OLED structure 500 (FIG. 5). The pixel pad 610 may be formed by the same fabrication techniques as the TFT 604 or the holding capacitor 606 or by any number of other techniques known in the art. The pixel pad 610 may be made from tin, silver, aluminum, indium, or any number of alloys. In some embodiments, the pixel pads 610 may be about 50 µm to 1 mm in width. In other embodiments, the pixel pads 610 may be interconnected or may be larger in size to create a segmented display. The pixel pad 610 may have a melting point of 110° C., 130° C., 150° C., or higher.

The pixel pad 610 is not limited to metals, as other structures may be used. For example, the pixel pad 610 may be formed from an epoxy or other polymers containing embedded conductive materials. In this embodiment, the pixel pad 610 may be formed by knife coating, printing, or ink-jetting, followed by curing. The pixels 600 of the electronic backplane structure may be laminated to the OLED structures 500 discussed with respect to FIG. 5 to form a display, as discussed with respect to FIG. 7.

Figure 7:
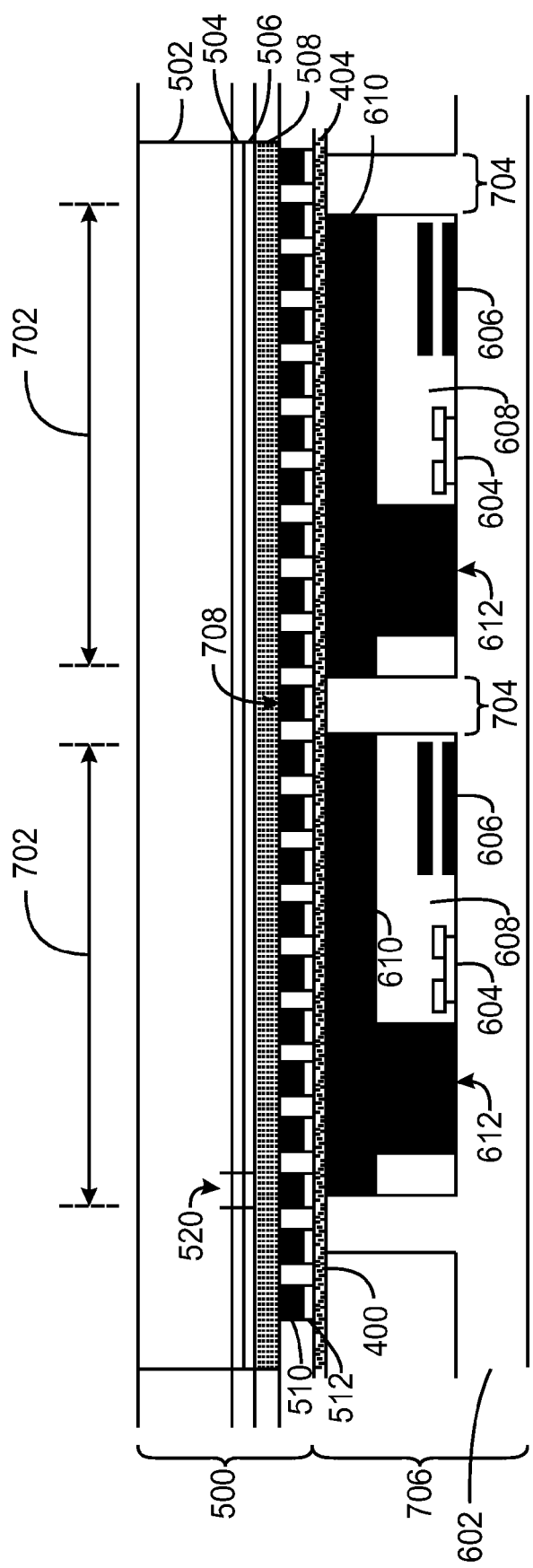
FIG. 7 is a cross sectional view of a laminated display, in accordance with embodiments.

FIG. 7 is a cross sectional view of a laminated display 700, in accordance with embodiments. In FIG. 7, like numbered structures are as described with respect to FIGS. 5 and 6. The laminated display 700 has a number of pixels 702 defined by the area of each of the pixel pads 610. Each of the pixel pads 610 may be separated from other pixel pads 610 by an insulating region 704. The insulating region 704 may be thicker than the microelectrode stack and function as a protection layer preventing the conductive particles of the lamination step from puncturing the OLED stack 504-508. The insulating region 704 may be fabricated using self aligned lithography, back side illumination and may consist of materials such as SiN, SU8 or other photo or insulating polymers. However, in an embodiment, the insulating region 704 may not be used, since the OLED material itself may have limited conductivity. The insulating region 704 may be a portion of the substrate 602 of the electronic backplane 706 that extends up between cells, for example, if the substrate 602 was formed with recessed regions to hold the pixel electronics. In other embodiments, the insulating regions 704 may be formed at the same time as the electronics, for example, using the same fabrication techniques. Further, the insulating region 704 may extend upwards through the lamination layer 404, for example, if the lamination layer has been patterned.

The current to energize the micro-OLEDs 500 can be carried through the anisotropic conductors 404 embedded within the lamination material 400. As the current is carried from front to back through the lamination material 400, and not along the lamination material 400, any micro-OLED structure, such as structure 708, that overlies an insulating region 704 is not active in the final display. Accordingly, perfect alignment between the electronic backplane 706 and the OLED structures 500 is not needed. Imperfections in the alignment will merely result in energization of a slightly different set of micro-OLEDs 520, essentially resulting in a self alignment during the lamination. The edges of the laminated structure may be sealed, for example, with an applied edge cap, to prevent damage to the unit from infiltration of oxygen or moisture.

Figure 8:
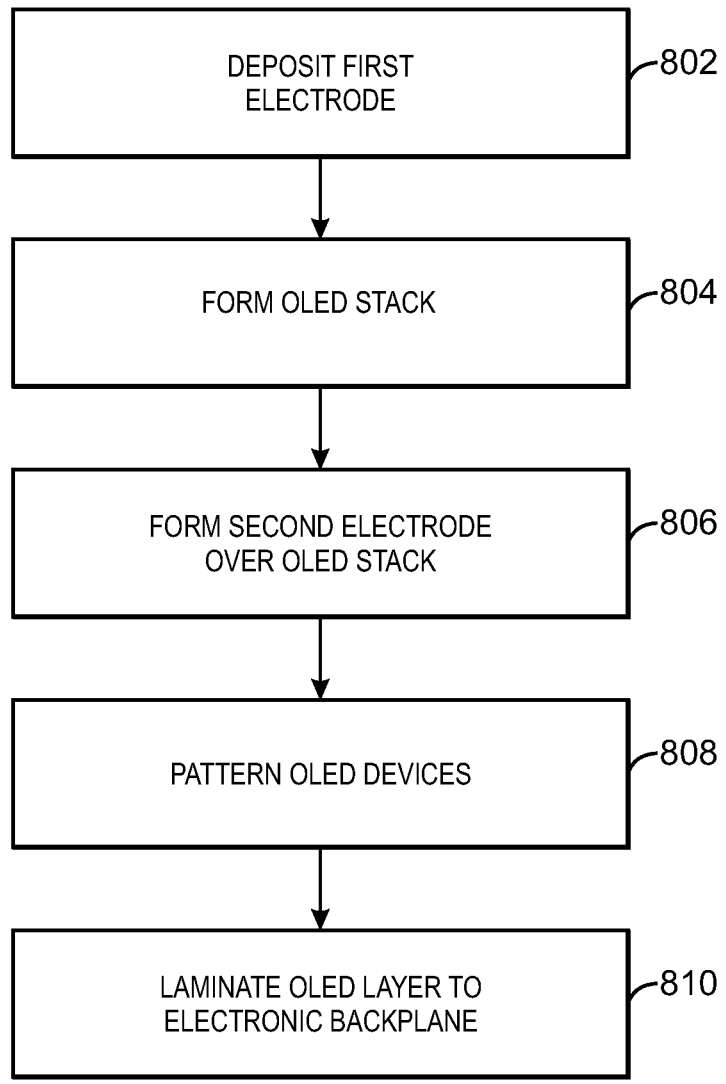
FIG. 8 is a block diagram of a method for forming OLED structures, in accordance with embodiments.

FIG. 8 is a block diagram of a method 800 for forming OLED structures, in accordance with embodiments. The method 800 begins at block 802 with the formation of a first electrode over a substrate. The first electrode may be a substantially transparent electrode as discussed with respect to FIG. 5. At block 804, an OLED stack may be formed over the substantially transparent electrode. The OLED stack generally includes a number of layers, including a hole injection layer (if present), a hole transport layer (if present), an organic emitting material layer, and an electron injection layer. At block 806, a second electrode can be formed over the OLED stack, for example, a metal cathode may be deposited over the electron injection layer. At block 808, the micro-OLED devices may be created by patterning the electrode injection layer and the metal cathode, for example, using one of the processes described with respect to FIG. 5. An optional additional step would be to deposit and pattern a material between the pixels to seal the pixels, eliminate shorts, and protect the top surface of the pixel from mechanical damage.

At block 810, the micro-OLED structures, described with respect to FIG. 5, may be laminated to an electronic backplane using a lamination layer that includes an anisotropic conducting material. The lamination process may be generally performed as described with respect to FIG. 3. The resulting display structure may be used in any number of electronic devices, as discussed with respect to FIG. 9.

Figure 9:
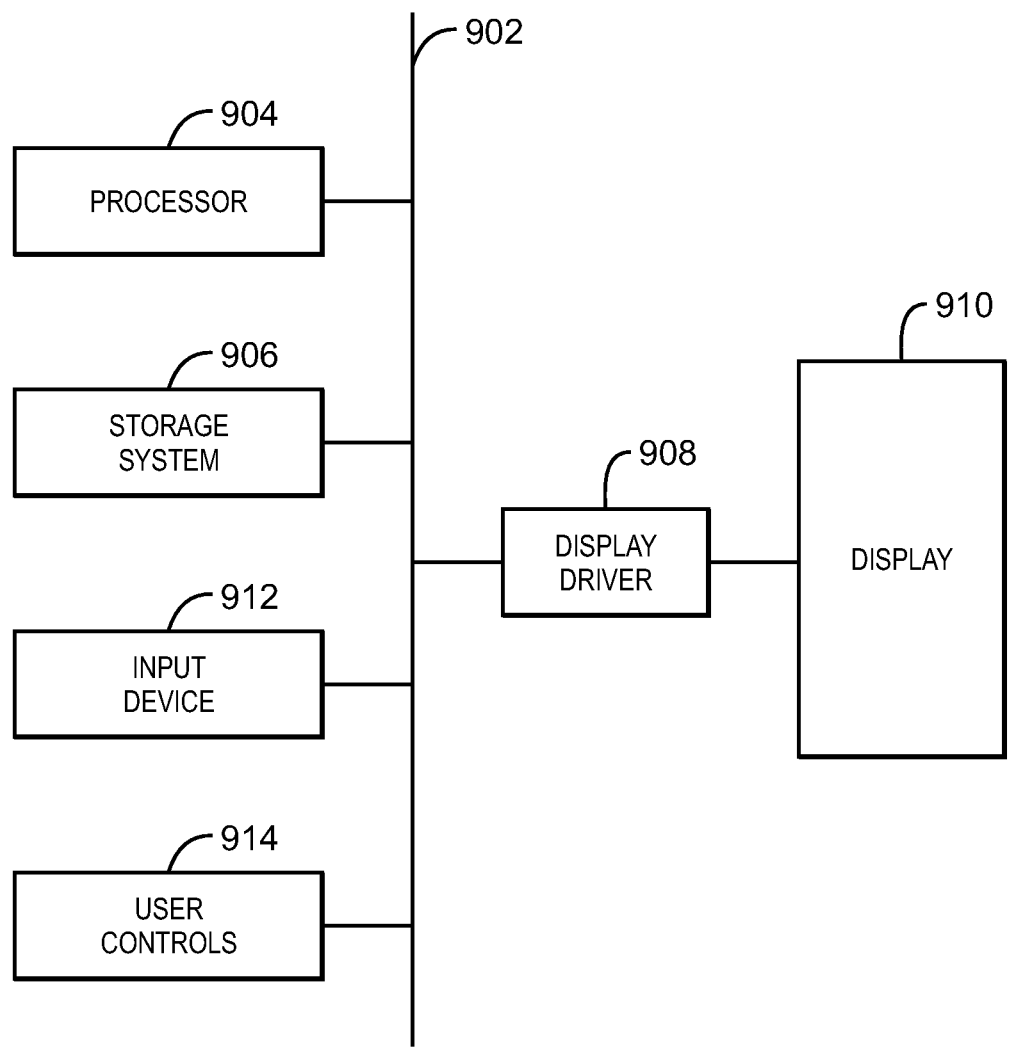
FIG. 9 is a block diagram of an electronic device that uses a micro-OLED display structure, in accordance with embodiments.

FIG. 9 is a block diagram of an electronic device 900 that uses a micro-OLED display structure, in accordance with embodiments. The electronic device 900 may have a bus 902. A processor 904 may access a storage system 906 to obtain code configured to direct the processor 904 to obtain data over the bus 902 and provide the data to a display driver 908 for rendering on an OLED display 910. The storage system 906 may include any combination of read only memory (ROM), random access memory (RAM), hard drives, optical drives, RAM drives, or flash drives. The data may also be provided to the processor by an input system 912, for example, coupled to a cable network, a satellite uplink, a home network, a local area network, a wide area network, the Internet, or any combinations thereof. The electronic device 900 may be controlled using user controls 914, which may include, for example, a keyboard, a mouse, a remote control, buttons on the unit, or any combinations thereof. The electronic device 900 may include a television, a monitor, an all-in-one computer, a personal information device, a mobile phone, a large display screens (such as a stadium display), a sign, and the like.

What is claimed is:

1. A method of forming a display, comprising:
   forming a first electrode layer on a first substrate;
   forming an organic light emitting diode (OLED) stack on the first electrode layer;

forming a second electrode layer over the OLED stack;

patterning the second electrode layer to form a plurality of micro-OLEDs; and laminating the plurality of micro-OLEDs on the first substrate to a plurality of pixels in an electronic backplane on a second substrate, wherein a lamination material comprising a conducting material is disposed between the plurality of micro-OLEDs and the plurality of pixels, and wherein any one pixel in the electronic backplane can couple to a varied subset of micro-OLEDs in the plurality of micro-OLEDs.

2. The method of claim 1, wherein forming OLED stack comprises:

depositing a hole transport layer;

depositing an organic light emitting material layer; and depositing an electron injection layer.

3. The method of claim 1, wherein forming the second electrode layer over the OLED stack comprises vapor deposition of a metal layer over the OLED stack.

4. The method of claim 1, wherein forming the lamination material comprises incorporating an anisotropic conduction material into a polymeric host material.

5. The method of claim 1, wherein the portion of the second electrode layer is removed by laser ablation.

6. The method of claim 1, wherein the patterning is performed by:

cold-welding the portion of the second electrode layer to a patterned die; and removing the cold-welded portion from the surface of the OLED stack.

7. The method of claim 1, wherein patterning the second layer of micro OLEDs comprises sealing offset layers in the space between the micro-OLEDS.

8. The method of claim 1, wherein joining comprises:

applying heat to melt the lamination material; and applying pressure to join the OLED structure on the first substrate to one side of the lamination material and an active side of an electronic backplane on the second substrate to the opposing side of the lamination material.

* * * * *